United States Patent
Watanabe

(10) Patent No.: US 11,081,439 B2
(45) Date of Patent: Aug. 3, 2021

(54) INTEGRATED CIRCUIT AND ELECTRONIC CIRCUIT COMPRISING THE SAME

(71) Applicants: Kabushiki Kaisha Toshiba, Tokyo (JP); Toshiba Electronic Devices & Storage Corporation, Tokyo (JP)

(72) Inventor: Kentaro Watanabe, Kawasaki Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/559,199

(22) Filed: Sep. 3, 2019

(65) Prior Publication Data

US 2020/0168539 A1    May 28, 2020

(30) Foreign Application Priority Data

Nov. 26, 2018    (JP) .............................. JP2018-220601

(51) Int. Cl.
| | |
|---|---|
| *H01L 23/498* | (2006.01) |
| *H01L 23/50* | (2006.01) |
| *H01L 23/00* | (2006.01) |
| *H05K 1/16* | (2006.01) |

(52) U.S. Cl.
CPC .. *H01L 23/49838* (2013.01); *H01L 23/49822* (2013.01); *H01L 23/50* (2013.01); *H01L 24/06* (2013.01); *H01L 24/48* (2013.01); *H05K 1/162* (2013.01); *H05K 1/165* (2013.01); *H05K 1/167* (2013.01); *H01L 2224/48227* (2013.01); *H01L 2924/14* (2013.01); *H01L 2924/15312* (2013.01)

(58) Field of Classification Search
CPC ......... H01L 23/49838; H01L 23/49822; H01L 23/30; H01L 24/06; H01L 24/48; H01L 2224/48227; H05K 1/165; H05K 1/167
USPC .......................... 257/734, 678; 438/106, 121
See application file for complete search history.

(56) References Cited

U.S. PATENT DOCUMENTS

| | | | |
|---|---|---|---|
| 5,172,471 A * | 12/1992 | Huang | ................. H01L 23/5286 29/840 |
| 6,803,659 B2 | 10/2004 | Suwa et al. | |
| 8,994,470 B2 | 3/2015 | Sakai | |
| 2006/0103421 A1 * | 5/2006 | Hirata | ................. H01L 27/0292 257/725 |
| 2018/0287266 A1 * | 10/2018 | Madsen et al. | ...... H01Q 21/065 |

FOREIGN PATENT DOCUMENTS

| | | |
|---|---|---|
| JP | 4387076 B2 | 12/2009 |
| JP | 5931851 B2 | 6/2016 |
| JP | 6323672 B2 | 5/2018 |

* cited by examiner

*Primary Examiner* — Thinh T Nguyen
(74) *Attorney, Agent, or Firm* — White & Case LLP

(57) ABSTRACT

According to one embodiment, an integrated circuit includes a chip, a first pin, a second pin, and a third pin. The chip includes an internal circuit and a plurality of pads connected to the internal circuit. The first pin is connected to a first pad among the plurality of pads. The first pin is connected to a power supply provided outside the integrated circuit. The second pin is connected to a second pad among the plurality of pads. The second pin is connected to a ground provided outside the integrated circuit. The third pin is connected to the second pin inside the integrated circuit via a third pad among the plurality of pads. The third pin is insulated from the second pin outside the integrated circuit.

8 Claims, 5 Drawing Sheets

INTEGRATED CIRCUIT AND ELECTRONIC CIRCUIT COMPRISING THE SAME

CROSS-REFERENCE TO RELATED APPLICATIONS

This application is based upon and claims the benefit of priority from the Japanese Patent Application No. 2018-220601, filed Nov. 26, 2018, the entire contents of which are incorporated herein by reference.

FIELD

Embodiments described herein relate generally to an integrated circuit and an electronic circuit comprising the same.

BACKGROUND

An integrated circuit obtained by integrating semiconductor elements and the like is known. An external capacitor may be connected to the integrated circuit. This external capacitor is called a decoupling capacitor, a bypass capacitor, or the like, and suppresses variations in power supply potential inside the integrated circuit.

DETAILED DESCRIPTION

In general, according to one embodiment, an integrated circuit includes a chip, a first pin, a second pin, and a third pin. The chip includes an internal circuit and a plurality of pads connected to the internal circuit. The first pin is connected to a first pad among the plurality of pads. The first pin is connected to a power supply provided outside the integrated circuit. The second pin is connected to a second pad among the plurality of pads. The second pin is connected to a ground provided outside the integrated circuit. The third pin is connected to the second pin inside the integrated circuit via a third pad among the plurality of pads. The third pin is insulated from the second pin outside the integrated circuit.

Hereinafter, embodiments will be described with reference to the drawings.

First Embodiment

Figure 1:
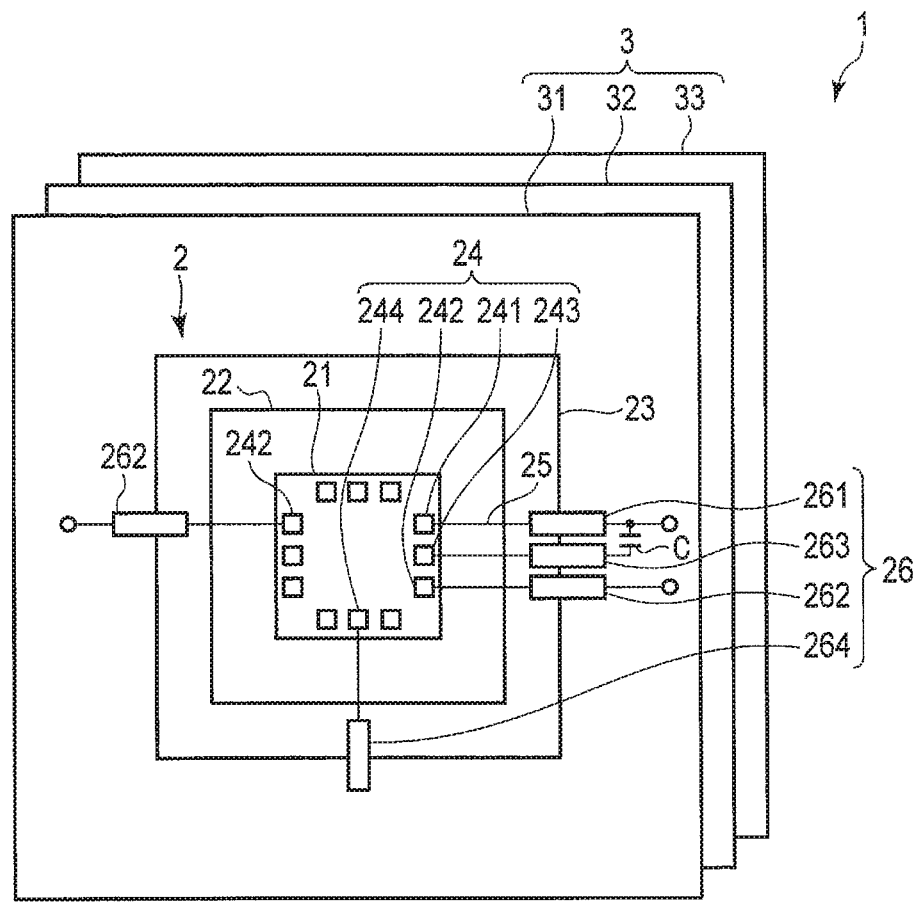
FIG. 1 is a schematic view of an electronic circuit according to a first embodiment.

FIG. 1 is a schematic view of an electronic circuit according to a first embodiment. An electronic circuit 1 includes an integrated circuit 2 and a circuit board 3.

The integrated circuit 2 includes an LSI chip 21 obtained by integrating semiconductor elements and the like, and a bed 22. The LSI chip 21 and the bed 22 are enclosed in a package 23 of the integrated circuit 2.

A plurality of pads 24 are formed on the outer periphery of the LSI chip 21. The pad 24 is a pad for electrically connecting an internal circuit formed inside the LSI chip 21 and a circuit element and the like provided for the circuit board 3. The pad 24 has a power supply pad 241 as a first pad, two first ground pads 242 as second pads, a second ground pad 243 as a third pad, and an input/output pad 244. Each of these pads is connected to a pin 26 formed in the package 23 of the integrated circuit 2 via a bonding wire 25. In addition, one of the first ground pads 242 and the second ground pad 243 are connected each other in the internal circuit of the LSI chip 21.

The pin 26 has a power supply pin 261 as a first pin, a first ground pin 262 as a second pin, a second ground pin 263 as a third pin, and an input/output pin 264. FIG. 1 merely shows the power supply pin 261, the first ground pin 262, the second ground pin 263, and the input/output pin 264, while the pin 26 may have pins other than these pins.

The power supply pin 261 is connected to the power supply pad 241 of the LSI chip 21 via the bonding wire 25. In addition, the power supply pin 261 is connected to a power supply provided for the circuit board 3 by way of a through-hole formed in the circuit board 3.

In the example of FIG. 1, the first ground pin 262 includes two first ground pins. The respective first ground pins 262 are connected to the first ground pads 242 of the LSI chip 21 via the bonding wires 25. In addition, the respective first ground pins 262 are connected to a ground provided for the circuit board 3 by way of through-holes formed in the circuit board 3.

The second ground pin 263 is connected to the second ground pad 243 of the LSI chip 21 via the bonding wire 25. One of the first ground pins 262 and the second ground pin 263 are connected in the internal circuit of the LSI chip 21. On the other hand, the second ground pin 263 is insulated from the respective first ground pins 262 outside the LSI chip 21. Here, it is desirable that the second ground pin 263 is formed close to one of the first ground pins 262. It is sufficient if "close" herein represents such a degree of closeness that the potential of the second ground pin can be regarded as a potential substantially equal to the potential of the first ground pins.

The input/output pin 264 is connected to the input/output pad 244 of the LSI chip 21 via the bonding wire 25. The input/output pin 264 is a pin for signal input or signal output of the internal circuit of the LSI chip 21.

As shown in FIG. 1, a capacitor C is connected between the power supply pin 261 and the second ground pin 263. The capacitor C conducts a DC power supply current supplied from a power supply to the internal circuit of the LSI chip 21, and flows a noise current produced along with the operation of the internal circuit of the LSI chip 21 or the like to the ground via the second ground pin 263. Accordingly, the capacitor C suppresses a flow of the noise current into the power supply.

The bed 22 is a plate on which the LSI chip 21 is mounted. The bed 22 is a metal plate, for example, but may not be a metal plate. In addition, only part of the bed 22 may include a metal plate. In a case where the bed 22 has a metal plate portion, this metal plate portion may be used as the ground of the LSI chip 21.

The circuit board 3 is a substrate on which the integrated circuit 2 is mounted. The circuit board 3 includes a signal wiring layer 31, a ground plane 32, and a power supply layer 33, for example. The signal wiring layer 31 is a layer in which a circuit of the electronic circuit 1, including a signal wire connected to the internal circuit of the LSI chip 21, is formed. The ground plane 32 is a metal plate formed under the signal wiring layer 31 with the interposition of an interlayer insulating film not shown, for example. The first ground pin 262 is connected to the ground plane 32 by way of a through-hole formed in the signal wiring layer 31. Accordingly, the potential of the first ground pin 262 becomes a predetermined ground potential (for example, 0 V). The power supply layer 33 is a metal plate formed under the ground plane 32 with the interposition of an interlayer insulating film not shown, for example. The power supply is connected to the power supply layer 33. The power supply pin 261 is connected to the power supply layer 33 by way of through-holes formed in the signal wiring layer 31 and the ground plane 32. Accordingly, power may be supplied to the internal circuit of the LSI chip 21 from the power supply connected to the power supply layer 33.

Figure 2:
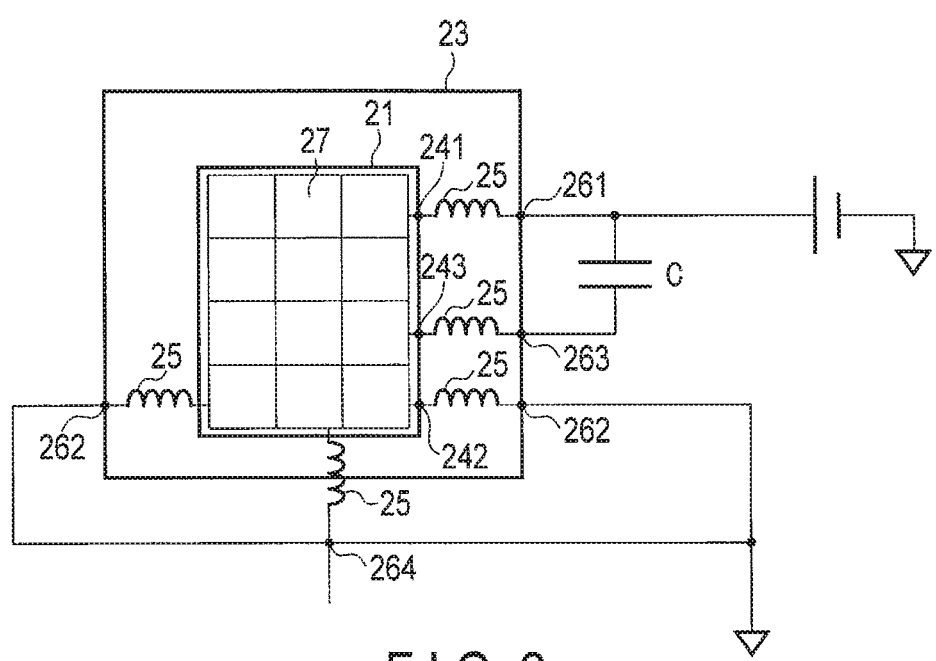
FIG. 2 is a diagram showing an inner configuration of an integrated circuit.

FIG. 2 is a diagram showing an internal configuration of the LSI chip 21. As shown in FIG. 2, a circuit network 27 is formed in the internal circuit of the LSI chip 21. The internal circuit of the LSI chip 21 may be any circuit that conforms to a request for the electronic circuit 1. Therefore, illustration of a detailed configuration of the circuit network 27 of the LSI chip 21 is omitted in FIG. 2.

As shown in FIG. 2, the power supply pin 261, the first ground pins 262, the second ground pin 263, and the input/output pin 264 are each connected to the internal circuit of the LSI chip 21 via the bonding wire 25. In such a configuration, the internal circuit operates in accordance with power supplied via the power supply pin 261. In addition, various signals may be input to the internal circuit via the input/output pin 264. In addition, various signals may be output from the internal circuit via the input/output pin 264. Further, with the first ground pins 262 being connected to the ground plane 32, a reference potential of the internal circuit is set at a predetermined ground potential.

As shown in FIG. 2, the first ground pin 262 and the second ground pin 263 are directly connected in the circuit network 27 formed in the internal circuit without the interposition of an element such as a resistor. Thus, the potential of the second ground pin 263 also becomes substantially equal to the ground potential. On the other hand, as shown in FIG. 1, the first ground pin 262 and the second ground pin 263 are insulated because of spatial separation outside the LSI chip 21.

In addition, as described earlier, the capacitor C is connected between the power supply pin 261 and the second ground pin 263. This capacitor C is inserted between the power supply pin 261 and the second ground pin 263 in order to suppress variations in a power supply voltage along with the occurrence of a high frequency current in the internal circuit.

Hereinafter, the electronic circuit according to the first embodiment will be described further. The electronic circuit 1 according to the embodiment includes the second ground pin 263 connected to the first ground pin 262 in the internal circuit of the LSI chip 21 and insulated from the first ground pin 262 outside the LSI chip 21. The effect obtained by providing this second ground pin 263 will be described while making comparison with a case in which the second ground pin 263 is not provided.

Figure 3:
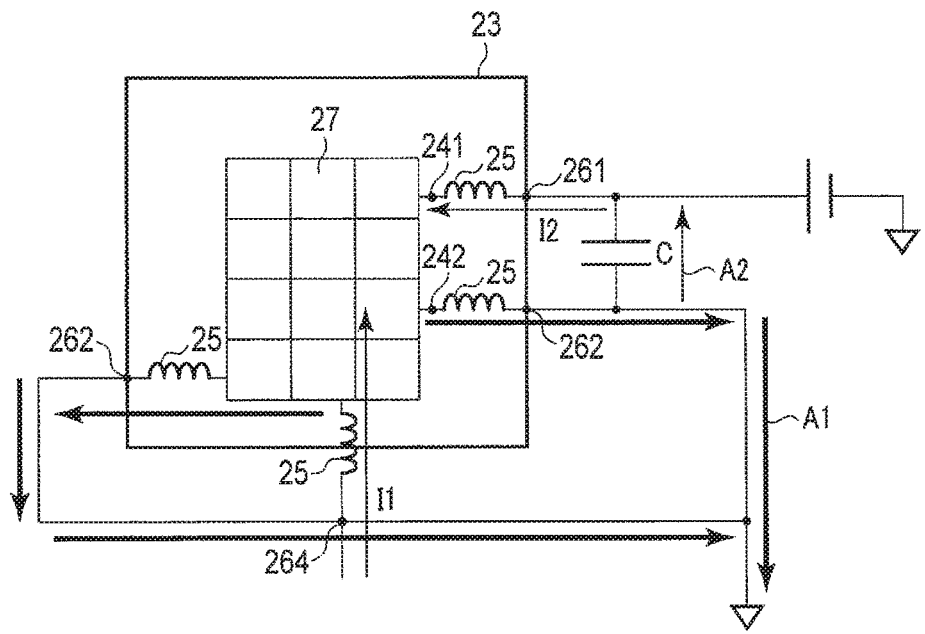
FIG. 3 is a diagram schematically showing a current flowing in an electronic circuit when an impulse current for a noise test is injected from an input/output pin of the electronic circuit not provided with a second ground pin.

FIG. 3 is a diagram schematically showing a current flowing in an electronic circuit when an impulse current for a noise test, for example, is injected from an input/output pin of the electronic circuit not provided with the second ground pin.

When an impulse current is injected from the input/output pin 264, this impulse current I1 flows through respective parts of the internal circuit of the LSI chip 21, and is then directed to the ground plane 32 external to the LSI chip 21 via the first ground pin 262, as indicated by a bold arrow A1.

Here, at a timing of current change at an instant when the impulse current is injected, a potential VSS of the first ground pad 242 varies because of the influence of an inductance component that the bonding wire 25 has. When a potential variation occurs, a current I2 shunted from the impulse current I1 flows in the capacitor C as indicated by an illustrated thin arrow A2.

The current I2 flows in the power supply pin 261 via the bonding wire 25. As a result, a potential VDDC of the power supply pad 241 also varies. In such a manner, a VDDC-VSS potential equivalent to the voltage of the power supply applied to the internal circuit of the LSI chip 21 varies. Therefore, the operation of the internal circuit becomes unstable.

Figure 4:
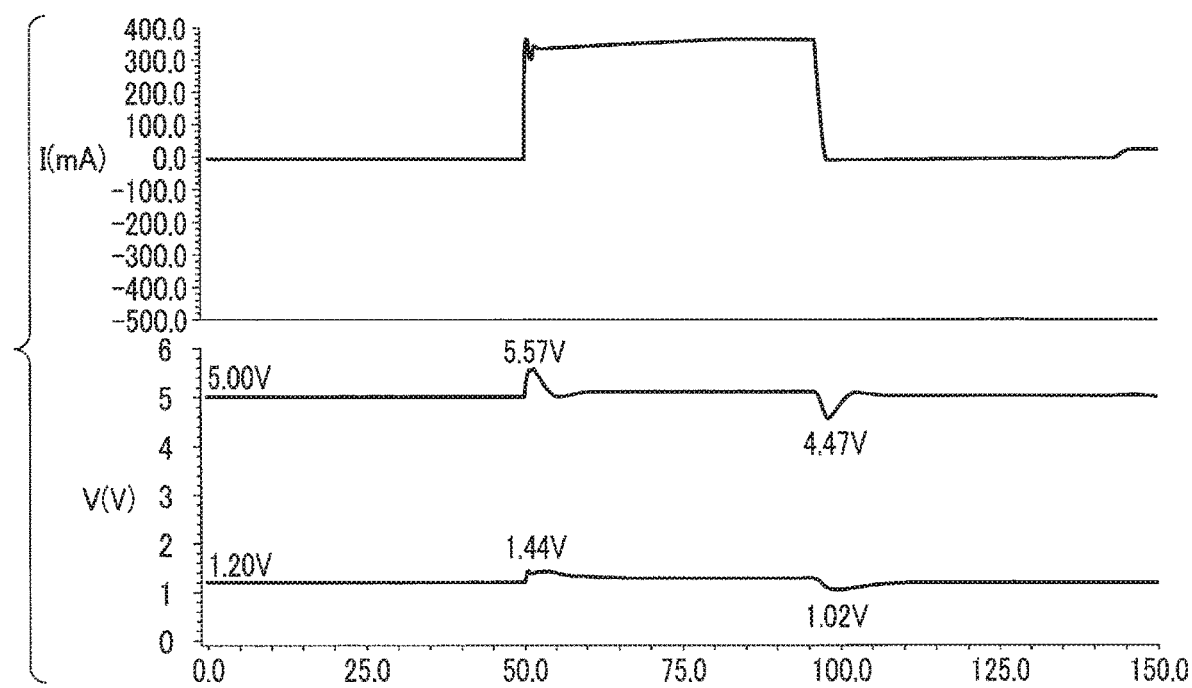
FIG. 4 is a diagram showing a result of an example in which variations in potential of a power supply pin with respect to an input current when an impulse current for a noise test is injected from an input/output pin of the electronic circuit not provided with a second ground pin are obtained by simulation.

FIG. 4 is a diagram showing a result of an example in which variations in the potential VDDC of a power supply pin with respect to an input current when an impulse current for a noise test is injected from an input/output pin of an electronic circuit not provided with the second ground pin are obtained by simulation. Note that FIG. 4 shows a result obtained when the potential of the power supply connected to the internal circuit is set at 5 V and a result obtained when the potential of the power supply connected to the internal circuit is set at 1.2 V. In addition, FIG. 4 assumes that an impulse current for a noise test is injected, while the results shown in FIG. 4 also apply similarly to a case in which an impulse current is produced because of some disturbance or the like in the internal circuit of the LSI chip 21.

As shown in FIG. 4, the potential VDDC of the power supply pin varies at each of falling and rising timings of the input current. Specifically, when the power supply potential is 5.00 V, the potential VDDC of the power supply pad 241 varies to 5.57 V at the falling timing of the input current, and the potential VDDC of the power supply pad 241 varies to 4.47 V at the rising timing of the input current. Similarly, when the power supply potential is 1.20 V, the potential VDDC of the power supply pad 241 varies to 1.44 V at the falling timing of the input current, and the potential VDDC of the power supply pad 241 varies to 1.02 V at the rising timing of the input current.

In such a manner, in the case in which the second ground pin 263 is not provided, variations in power supply potential is caused by the capacitor C essentially provided for suppressing variations in power supply potential.

Figure 5:
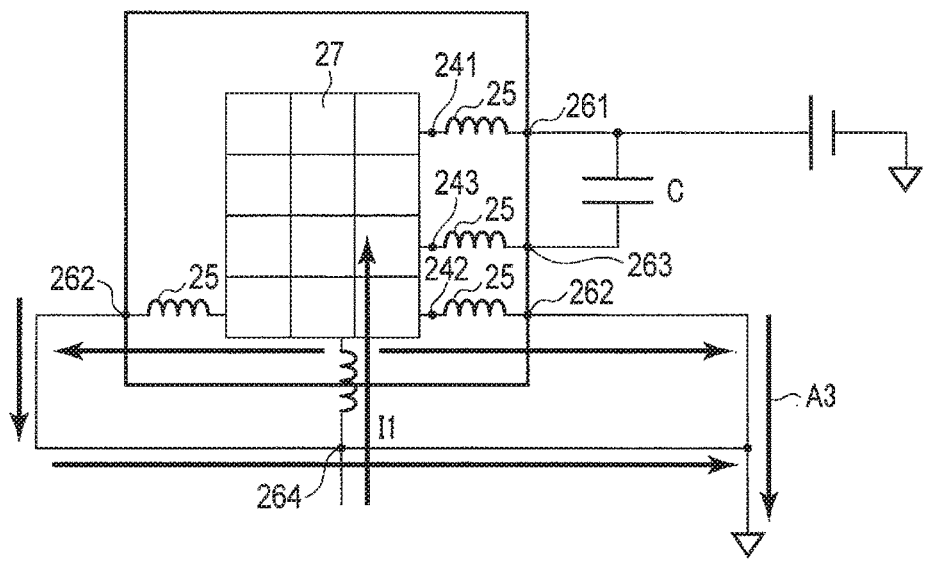
FIG. 5 is a diagram schematically showing a current flowing in an electronic circuit when an impulse current for a noise test, for example, is injected from an input/output pin of the electronic circuit provided with a second ground pin.

FIG. 5 is a diagram schematically showing a current flowing in an electronic circuit when an impulse current for a noise test, for example, is injected from an input/output pin of the electronic circuit provided with a second ground pin.

When an impulse current is injected from the input/output pin 264, this impulse current I1 flows through respective parts of the internal circuit of the LSI chip 21, and is then directed to the ground plane 32 external to the LSI chip 21 via the first ground pins 262, as indicated by a bold arrow A3.

Here, at a timing of current change at an instant when the impulse current is injected similarly to the example of FIG. 3, a potential VSS1 of the first ground pad 242 varies because of the influence of an inductance component that the bonding wire 25 has. On the other hand, for the second ground pin 263, a current does not flow because of the inductance of the bonding wire 25, so that a potential VSS2 of the second ground pin 263 does not vary. This potential VSS2 is substantially equal to the potential VSS1 before variation.

Since the potential VSS2 of the second ground pin 263 does not vary, a current resulting from a potential variation of the first ground pad 242 also does not flow in the capacitor C connected between the power supply pin 261 and the second ground pin 263. Thus, a current resulting from a potential variation of the first ground pad 242 does not flow in the power supply pin 261, so that the potential VDDC of the power supply pad 241 does not vary. Thus, the VDDC-VSS2 potential equivalent to the voltage of the power supply applied to the internal circuit of the LSI chip 21 also does not vary. Therefore, the operation of the internal circuit is stabilized.

Figure 6:
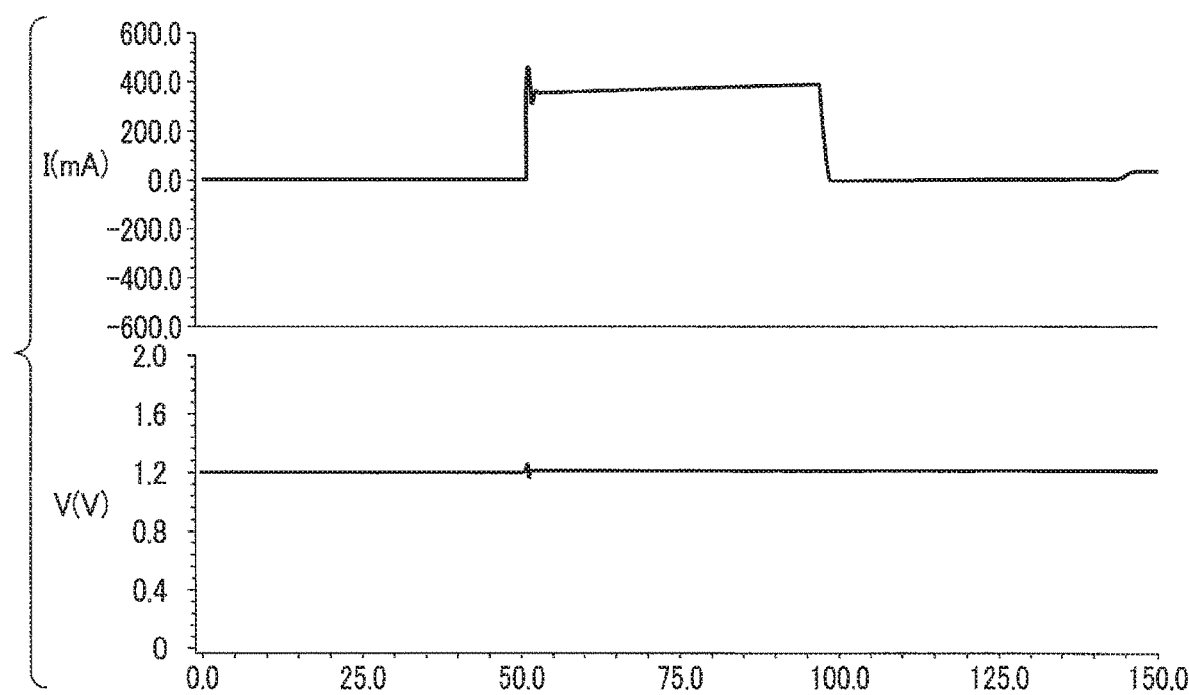
FIG. 6 is a diagram showing a result of an example in which variations in potential of a power supply pin with respect to an input current when an impulse current for a noise test is injected from an input/output pin of the electronic circuit provided with a second ground pin are obtained by simulation.

FIG. 6 is a diagram showing a result of an example in which variations in potential of a power supply pad with respect to an input current when an impulse current for a noise test is injected from an input/output pin of an electronic circuit provided with a second ground pin are obtained by simulation. Note that FIG. 6 shows a result obtained when the potential of the power supply connected to the internal circuit is set at 1.2 V.

As shown in FIG. 6, the potential VDDC of the power supply pad 241 does not vary even at falling and rising timings of the input current.

According to the present embodiment as described above, the electronic circuit includes the second ground pin for an LSI chip, connected to the first ground pin inside the LSI chip and insulated from the first ground pin outside the LSI chip, in addition to the first ground pin connected to the ground plane of the circuit board. Because being insulated from the first ground pin outside the LSI chip, this second ground pin is not influenced by potential variations at the first ground pin. Therefore, by providing the capacitor between the power supply pin and the second ground pin, variations in power supply potential resulting from potential variations at the first ground pin can be suppressed while suppressing variations in power supply potential resulting from a current directed to the power supply from the electronic circuit.

In addition, the first ground pin and the second ground pin are arranged as close as possible although being insulated from each other outside the LSI chip. Accordingly, the potential difference between the first ground pin and the second ground pin can be reduced. Therefore, the potential of the second ground pin can be treated as the ground potential of the LSI chip.

Second Embodiment

Figure 7:
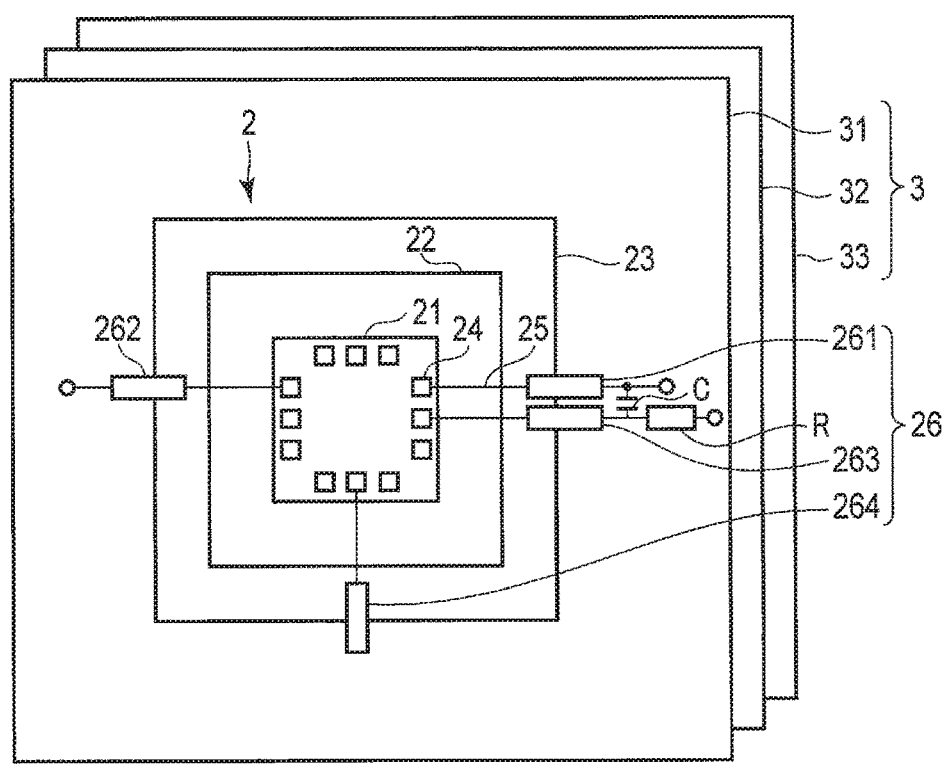
FIG. 7 is a diagram showing a second embodiment.

A second embodiment will be described. FIG. 7 is a schematic view of an electronic circuit according to the second embodiment. In the electronic circuit 1 of the second embodiment, the first ground pin 262 adjacent to the second ground pin 263 has been removed. In addition, the second ground pin 263 is connected to the ground plane 32 via a resistor R.

Since the resistor R is inserted between the second ground pin 263 and the ground plane 32, the second ground pin 263 can be assumed as being in a state insulated from the ground plane 32. Thus, a high frequency current resulting from potential variations at the first ground pad 242 is less likely to flow in the capacitor C via the second ground pin 263. Accordingly, variations in power supply potential may be suppressed further. In addition, in the second embodiment, the number of first ground pins can be reduced.

As the resistance value of the resistor R increases, the effect that a high frequency current resulting from potential variations at the first ground pad 242 is less likely to flow in the second ground pin 263 increases. On the other hand, as the resistance value of the resistor R increases, it is more difficult to maintain the potential of the second ground pin 263 at the ground potential. Therefore, it is desirable that the value of the resistor R falls within a specific range. The resistance value of the resistor R is 0.5Ω to 10Ω, for example.

Figure 8:
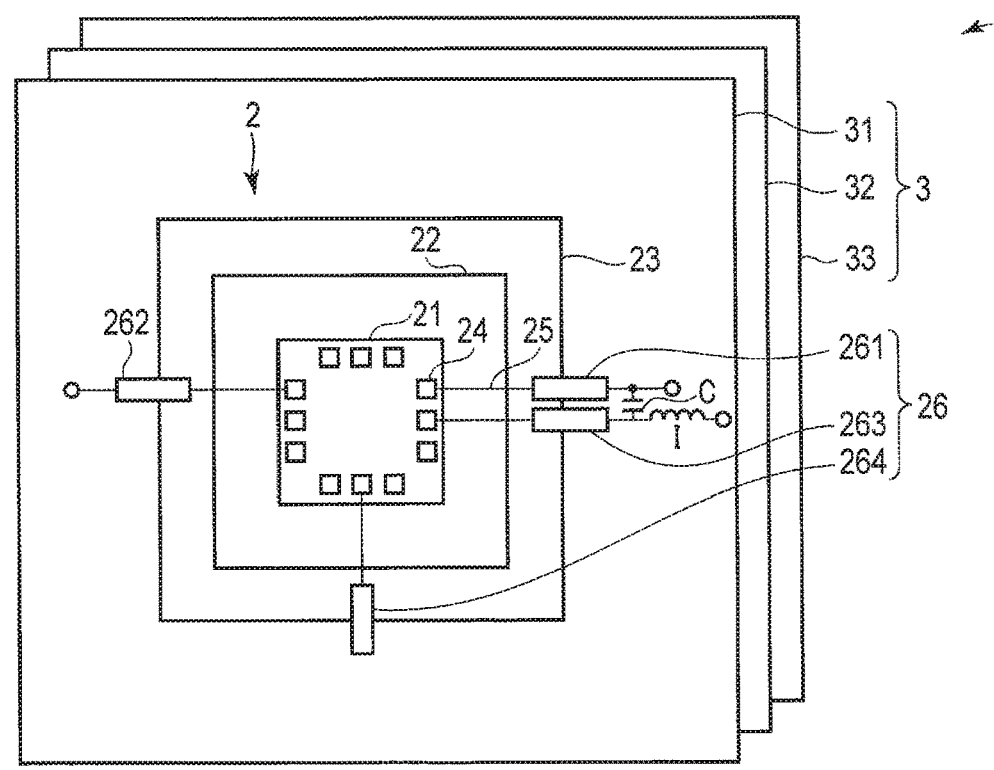
FIG. 8 is a diagram showing a modification of the second embodiment.

As shown in FIG. 8, an inductor I may be inserted between the second ground pin 263 and the ground plane 32, instead of the resistor R. The inductor I functions as a resistor with respect to a high frequency current such as an impulse noise current. Therefore, variations in power supply potential may be further suppressed even in the configuration of FIG. 8.

Third Embodiment

Figure 9:
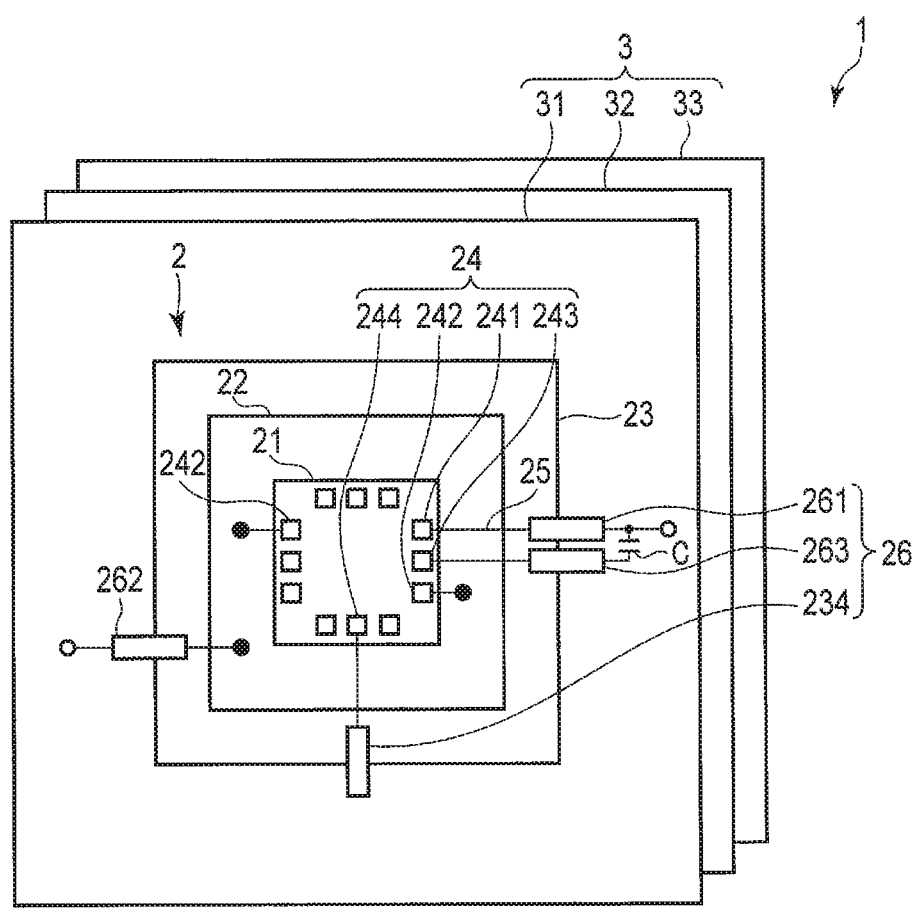
FIG. 9 is a schematic view of an electronic circuit according to a third embodiment.

FIG. 9 is a schematic view of an electronic circuit according to a third embodiment. Here, in FIG. 9, components common to those of FIG. 1 are denoted with reference numerals similar to those of FIG. 1, and description will be omitted as appropriate.

In the first embodiment, the pad 24 and the pin 26 are directly connected via the bonding wires 25, respectively. In contrast, in the second embodiment, the power supply pad 241 and the power supply pin 261, the second ground pad 243 and the second ground pin 263, and the input/output pad 244 and the input/output pin 264 are connected via the bonding wires, respectively, while the two first ground pads 242 are connected to the bed 22 made of metal. Then, the bed 22 and one of the first ground pins 262 are connected via the bonding wire. There is no other difference between FIGS. 1 and 9.

Even in the third embodiment, the first ground pin and the second ground pin are connected inside the LSI chip 21, and are insulated outside the LSI chip 21. Therefore, by providing a capacitor between the power supply pin and the second ground pin similarly to the first embodiment, variations in power supply potential resulting from potential variations at the first ground pad can be suppressed while suppressing variations in power supply potential resulting from a current directed to the power supply from the electronic circuit. In addition, in the third embodiment, the number of first ground pins can be reduced.

The examples of the second embodiment may also be applied to the third embodiment. That is, the resistor R or the inductance I may be inserted between the second ground pin 263 and the ground plane 32.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An integrated circuit comprising:
a chip including an internal circuit and a plurality of pads connected to the internal circuit;
a first pin connected to a first pad among the plurality of pads, the first pin connected to a power supply provided outside the chip;
a second pin connected to a second pad among the plurality of pads, the second pin connected to a ground provided outside the chip; and
a third pin connected to a third pad among the plurality of pads, the third pin being connected to the second pin in the internal circuit, the third pin being connected to a capacitor connected between the first pin and the power supply.

2. The integrated circuit according to claim 1, wherein the second pin and the third pin are arranged adjacent to each other.

3. The integrated circuit according to claim 1, wherein the first pad and the first pin, the second pad and the second pin, and the third pad and the third pin are connected via bonding wires, respectively.

4. An integrated circuit comprising:
a chip including an internal circuit and a plurality of pads connected to the internal circuit;
a first pin connected to a first pad among the plurality of pads, the first pin connected to a power supply provided outside the chip;
a plate on which the chip is mounted, the plate including a metal portion connected to a second pad among the plurality of pads;
a second pin connected to the metal portion, the second pin connected to a ground provided outside the chip; and
a third pin connected to a third pad among the plurality of pads, the third pin being connected to the second pin in the internal circuit, the third pin being connected to a capacitor connected between the first pin and the power supply.

5. An electronic circuit comprising:
an integrated circuit comprising
a chip having an internal circuit and a plurality of pads connected to the internal circuit,
a first pin connected to a first pad among the plurality of pads, the first pin connected to a power supply provided outside the chip,
a second pin connected to a second pad among the plurality of pads, the second pin connected to a ground provided outside the chip, and
a third pin connected to a third pad among the plurality of pads, the third pin being connected to the second pin in the internal circuit; and
a circuit board comprising
the power supply connected to the first pin,
the ground connected to the second pin, and
a capacitor connected between the first pin and the power supply,
wherein the third pin is connected to a capacitor connected between the first pin and the power supply.

6. The electronic circuit according to claim 5, wherein the third pin is connected to the ground via a resistor.

7. The electronic circuit according to claim 6, wherein the resistor has a resistance value which is more than or equal to $0.5\Omega$ and less than or equal to $10\Omega$.

8. The electronic circuit according to claim 5, wherein the third pin is connected to the ground via an inductor.

* * * * *